(12) United States Patent
Takata et al.

(10) Patent No.: US 6,625,855 B1
(45) Date of Patent: Sep. 30, 2003

(54) METHOD FOR PRODUCING SURFACE ACOUSTIC WAVE DEVICE

(75) Inventors: Eiichi Takata, Nagaokakyo (JP); Yasuji Yamamoto, Osaka (JP); Toshimaro Yoneda, Ishikawa-ken (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 217 days.

(21) Appl. No.: 09/678,928

(22) Filed: Oct. 4, 2000

(30) Foreign Application Priority Data

Oct. 6, 1999 (JP) .......................................... 11-285627

(51) Int. Cl.⁷ .............................................. H04R 17/00
(52) U.S. Cl. .................... 29/25.35; 29/594; 310/313 R; 310/312; 427/100; 216/67; 216/13
(58) Field of Search ................................ 29/25.35, 594, 29/595, 609.1; 310/313 R, 312; 427/100, 58, 377–79; 216/67, 13

(56) References Cited

U.S. PATENT DOCUMENTS

| | | | | |
|---|---|---|---|---|
| 4,672,254 A | * | 6/1987 | Dolat | 310/313 R |
| 4,890,369 A | * | 1/1990 | Tanski | 29/25.35 |
| 5,091,051 A | * | 2/1992 | Greer | 156/643 |
| 5,345,134 A | | 9/1994 | Greer | |
| 5,774,962 A | * | 7/1998 | Satoh | 29/25.35 |
| 5,815,900 A | * | 10/1998 | Ichikawa | 29/25.35 |
| 5,847,486 A | | 12/1998 | Kadota et al. | 310/313 R |
| 5,909,156 A | * | 6/1999 | Nishihara | 333/193 |
| 5,996,199 A | * | 12/1999 | Ichikawa | 29/25.35 |
| 6,131,257 A | * | 10/2000 | Nishihara | 29/25.35 |
| 6,136,175 A | * | 10/2000 | Stelzl | 205/220 |

FOREIGN PATENT DOCUMENTS

| | | | |
|---|---|---|---|
| DE | 39 32 451 A1 | 5/1990 | |
| JP | 3-171914 | 7/1991 | |
| JP | 8-018374 | 1/1996 | |
| JP | 63-285011 | * 11/1998 | ............ H03H/3/08 |

* cited by examiner

*Primary Examiner*—A. Dexter Tugbang
*Assistant Examiner*—Alan Boswell
(74) *Attorney, Agent, or Firm*—Keating & Bennett, LLP

(57) ABSTRACT

A method for producing a surface acoustic wave device, includes the steps of preparing a piezoelectric substrate, forming a thin film electrode on the piezoelectric substrate, etching the thin film electrode for forming an IDT, trimming at least one of the piezoelectric substrate and the IDT to adjust an operation frequency of the surface acoustic wave device, and rapidly altering the surface of the IDT for stabilizing the surface of the IDT.

20 Claims, 4 Drawing Sheets

METHOD FOR PRODUCING SURFACE ACOUSTIC WAVE DEVICE

BACKGROUND OF THE INVENTION

1. Field of the Invention

The present invention relates to a method for producing a surface acoustic wave device, and more specifically, the present invention relates to a method for producing a surface acoustic wave device that stabilizes frequency response characteristics after frequency adjustment.

2. Description of the Related Art

Conventional surface acoustic wave devices include a piezoelectric substrate made of quartz and an IDT made of, for example, an Au thin film, Ta thin film or W thin film that is disposed on the piezoelectric substrate. These conventional SAW devices utilize surface acoustic waves mainly comprising Shear Horizontal or "SH" waves, as described in U.S. Pat. No. 5,847,486.

Such surface acoustic wave devices are manufactured via the following steps. In a first step, a wafer made of quartz is prepared. In a second step, a metallic film mainly containing, for example, Ta, Au or W is formed on an upper surface of the wafer by, for example, vapor deposition or sputtering. In a third step, unnecessary portions of the metallic film are removed by etching to form a multitude of patterns each including a plurality of interdigital transducers or "IDTs" and a plurality of reflectors. In a fourth step, each combination of the IDTs and the reflectors is considered as one surface acoustic wave element, and the wafer is cut at areas where the IDTs and reflectors are not located. In a fifth step, the cut and divided surface acoustic wave elements are housed in a package, and electrodes of the package and the IDTs are electrically connected via bonding wires. In a sixth step, the IDTs and reflectors of the surface acoustic wave elements are etched to adjust frequency response characteristics to desired values, and a lid is put on the package and the package is sealed.

However, the surfaces of, for example, the IDTs and reflectors or piezoelectric substrates are trimmed in such a frequency adjustment procedure, and the surfaces of these components are activated and become unstable. Accordingly, if these components are left standing in the air after frequency adjustment, the activated surfaces of the electrodes are altered or deteriorated to increase the masses of the electrodes to thereby decrease the frequency $f_o$.

The variation in frequency due to alternation of the surfaces of the electrodes in the air is logarithmically proportional to time, and it is large immediately after frequency adjustment. Thereafter, the degree of alteration of the electrode surfaces gradually decreases, and, associated with this, the variation in frequency $f_o$ also tends to gradually decrease.

Accordingly, if a lid is put on the package and the package is sealed immediately after frequency adjustment, the package is sealed in a state where the frequency is rapidly varying. A time from frequency adjustment until sealing of the package is not constant, and the amounts of trimming upon frequency adjustment are not constant in individual surface acoustic wave devices. The frequency $f_o$ therefore largely varies from one surface acoustic wave device to another.

In addition, the development of variation in frequency after frequency adjustment does not stop even if the devices are left in the air or are simply subjected to a heat treatment, and the degree of variation in frequency after frequency adjustment cannot be predicted and an appropriate frequency adjustment cannot be performed.

SUMMARY OF THE INVENTION

In order to overcome the problems described above, preferred embodiments of the present invention provide a method for producing a surface acoustic wave device, which stabilizes the activated surfaces of electrodes such as IDTs after frequency adjustment, seals a device in a state where the frequency $f_o$ is stabilized, and finely and accurately controls the frequency of the device.

According to a first preferred embodiment of the present invention, a method for producing a surface acoustic wave device includes preparing the piezoelectric substrate, forming a thin film electrode on the piezoelectric substrate, etching thin film electrode for forming the IDT, trimming the piezoelectric substrate and the IDT for controlling frequency, and rapidly altering the surface of the IDT for stabilizing the surface of the IDT.

A method for producing a surface acoustic wave device according to another preferred embodiment includes a step of heating the IDT in an oxygen atmosphere or in air to oxidize a surface of the IDT during the step of stabilizing the surface of the IDT.

A method for producing a surface acoustic wave device according to another preferred embodiment of the present invention includes a step of heating the IDT in a nitrogen atmosphere to nitride the surface of the IDT in the step of stabilizing the surface of the IDT.

In another preferred embodiment of the present invention, a method for producing a surface acoustic wave device includes the step of finely controlling the frequency of the device by changing a heating temperature or heating time in the step for oxidizing or nitriding the surface of the IDT.

Other preferred embodiments may include the step of trimming the piezoelectric substrate and the IDT by physical collision of ions in the step for controlling the frequency.

According to various preferred embodiments of the present invention, the variation in frequency after frequency adjustment is minimized by oxidizing or nitriding the surface of IDT to thereby stabilize the surface of IDT.

As is described above, according to preferred embodiments of the present invention, an oxidized, nitrided, or another altered layer is rapidly formed on an activated surface of an electrode after frequency adjustment to thereby stabilize the characteristics of a surface acoustic wave device. Accordingly, the surface acoustic wave device can be packaged and sealed in a stable state with a less varied frequency, and precision after frequency adjustment is greatly improved.

In addition, the characteristics of the device are rapidly stabilized by a heat treatment, and a stable frequency is obtained in a short time, and a period of time until sealing of the package is greatly reduced. The time required for manufacturing the surface acoustic wave device is therefore greatly reduced.

Furthermore, the variation in frequency can be controlled by setting the temperature and time of heat treatment, and the frequency can be finely controlled after frequency adjustment procedure.

For the purpose of illustrating the present invention, there is shown in the drawings several forms that are presently preferred, it being understood, however, that the present invention is not limited to the precise arrangements and instrumentalities shown.

Other features, elements, characteristics and advantages of the present invention shall become apparent from the following detailed description of preferred embodiments thereof with reference to the attached drawings.

DETAILED DESCRIPTION OF PREFERRED EMBODIMENTS

Preferred embodiments of the present invention will be further illustrated with reference to the drawings.

FIGS. 1A to 1E are perspective view showing a method for producing a surface acoustic wave device according to a preferred embodiment of the present invention. Individual steps will be described below step by step.

Figure 1A:
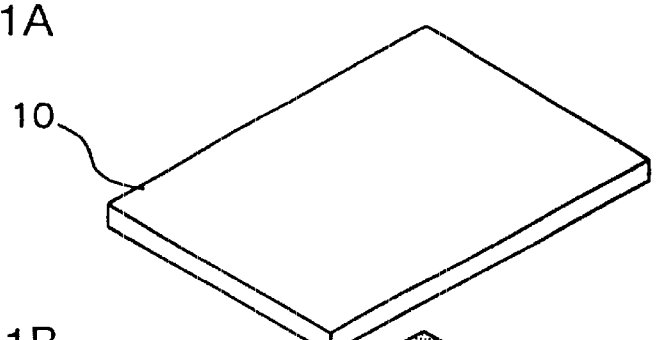
FIGS. 1A to 1E are perspective views illustrating a method of producing a surface acoustic wave device according to a first preferred embodiment of the present invention.
Figure 1B:
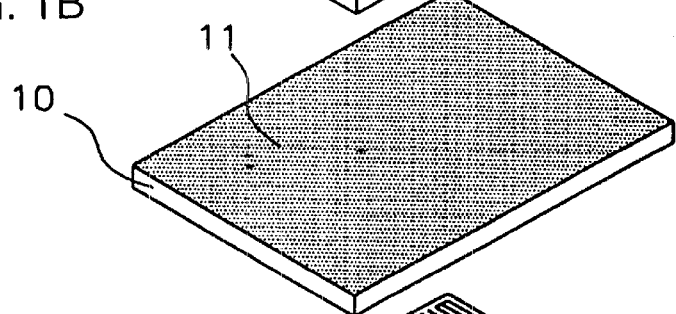
Figure 1C:
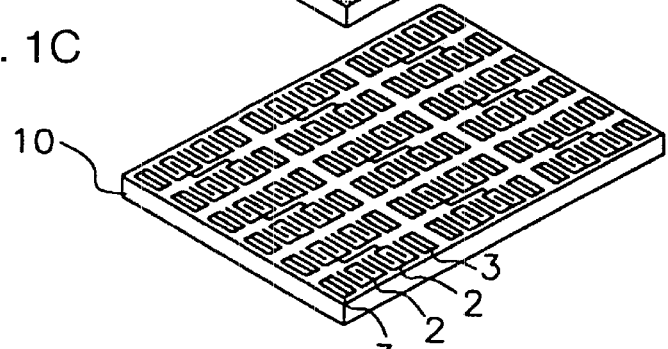
Figure 1D:
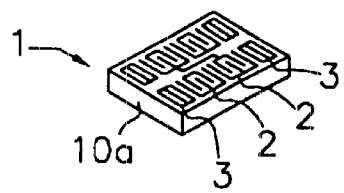
Figure 1E:
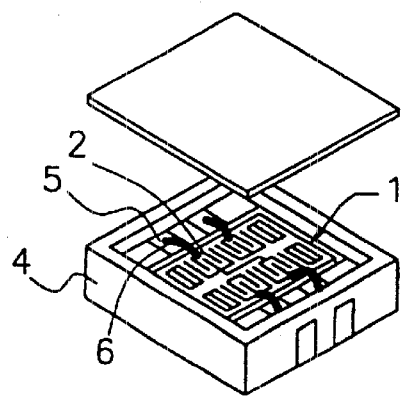

In a first step, a wafer 10 preferably made of quartz is prepared as shown in FIG. 1A. In a second step as shown in FIG. 1B, a metallic film 11 preferably mainly containing Ta is formed on an upper surface of the wafer 10 by, for example, vapor deposition or sputtering, or other suitable process. In a third step, unnecessary portions of the metallic film 11 are removed by etching to form a multitude of patterns each including a plurality of IDTs 2 and a plurality of reflectors 3 as shown in FIG. 1C. In this stage, frequency adjustment may be performed by reducing the thickness of the patterns on the wafer 10 by RIE (reactive ion etching). In a fourth step, each combination of the IDTs 2 and the reflectors 3 is considered as one surface acoustic wave element 1, and the wafer 10 is cut at areas where the IDTs 2 and reflectors 3 are not formed, as shown in FIG. 1D. In a fifth step, the divided surface acoustic wave element 1 is housed in a package 4, and an electrode 5 of the package 4 and the IDT 2 are electrically connected via a bonding wire 6, as shown in FIG. 1E. In a sixth step, at least one of the IDT 2, the reflector 3 of the surface acoustic wave element 1, and a piezoelectric substrate 10a is etched with ions to control frequency response characteristics to desired values. After the frequency adjustment, the device is subjected to a heat treatment in an oxygen atmosphere to increasingly oxidize the surfaces of electrodes such as the IDTs that have been activated by etching in the frequency adjustment procedure. A lid is then put on the package 4, and the package 4 is sealed.

Figure 2A:
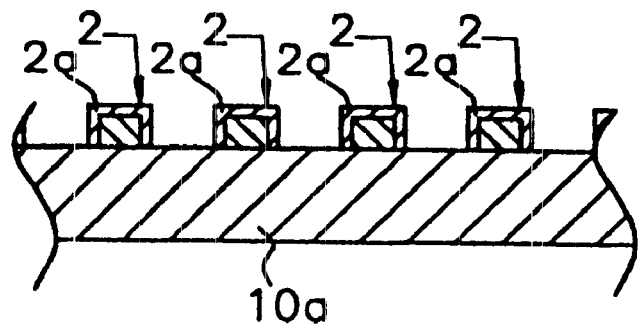
FIGS. 2A to 2C are a cross-sectional views showing the states of electrodes of the surface acoustic wave device from frequency adjustment to heat treatment according to the first preferred embodiment of the present invention.
Figure 2B:
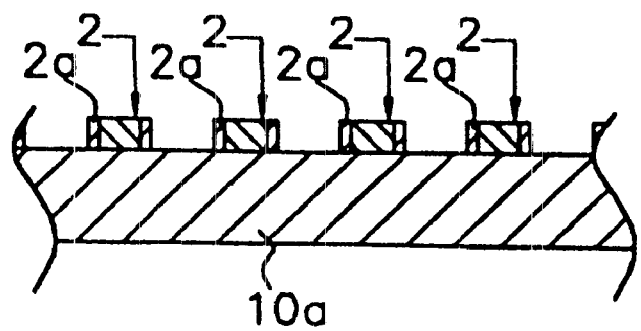
Figure 2C:
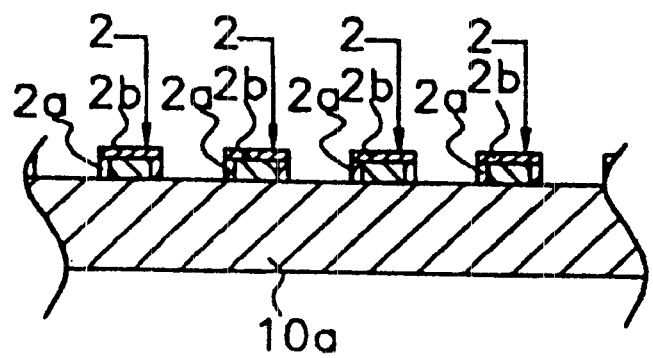

The procedures between frequency adjustment and heat treatment will be illustrated in further detail. FIGS. 2A to 2C are cross-sectional views showing the states of electrodes of a surface acoustic wave device which has been subjected to frequency adjustment by RIE.

As shown in FIG. 2A, an altered layer 2a is formed on the surface of the IDT 2 of the piezoelectric substrate 10a by, for example, oxidation in the air. The IDT 2 is trimmed by RIE in the frequency adjustment step, i.e., the sixth step shown in FIG. 1, the altered layer 2a on an upper surface of the IDT 2 disappears as shown in FIG. 2B. The upper surface of the IDT 2 is therefore activated. The RIE (reactive ion etching) technique is preferably used as a trimming technique in this procedure for the following reason. According to RIE, a material to be trimmed is allowed to react with a reaction gas for etching, and selective etching can be performed. For example, the IDT and reflector alone, or the piezoelectric substrate alone can be selectively etched. The altered layer 2a on a side surface of the IDT 2 remains in this procedure, because RIE is an anisotropic etching technique and the IDT is trimmed only in the thickness direction.

After the frequency adjustment as above, the element is subjected to a heat treatment in an oxygen atmosphere to form an altered layer 2b of a stable oxide film on the surface of the IDT 2, as shown in FIG. 2C, to thereby stabilize the surface of the IDT 2. It is to be noted that the element may be subject to a heat treatment in air which includes oxygen and nitrogen, as an oxidation reaction is faster than a nitridation reation. In this procedure, the temperature of the heat treatment is, for example, about 85° C. to about 150° C. when the element is packaged in consideration of the effect of a die bonding material. When the surface acoustic wave element being processed is intact, there is no need to consider the effect of such a die bonding material, and the heat treatment can be performed at a temperature of about 85° C. to about 250° C., i.e., the heat treatment can be performed at a higher temperature than the case when the device being processed is packaged. Accordingly, the device being processed can be oxidized in a shorter time. The variation in frequency due to the heat treatment is determined by the frequency immediately after frequency adjustment, and the frequency in frequency adjustment is adjusted in consideration of the above variation.

The variation in frequency according to preferred embodiments of the present embodiment will be illustrated with reference to FIG. 3.

Figure 3:
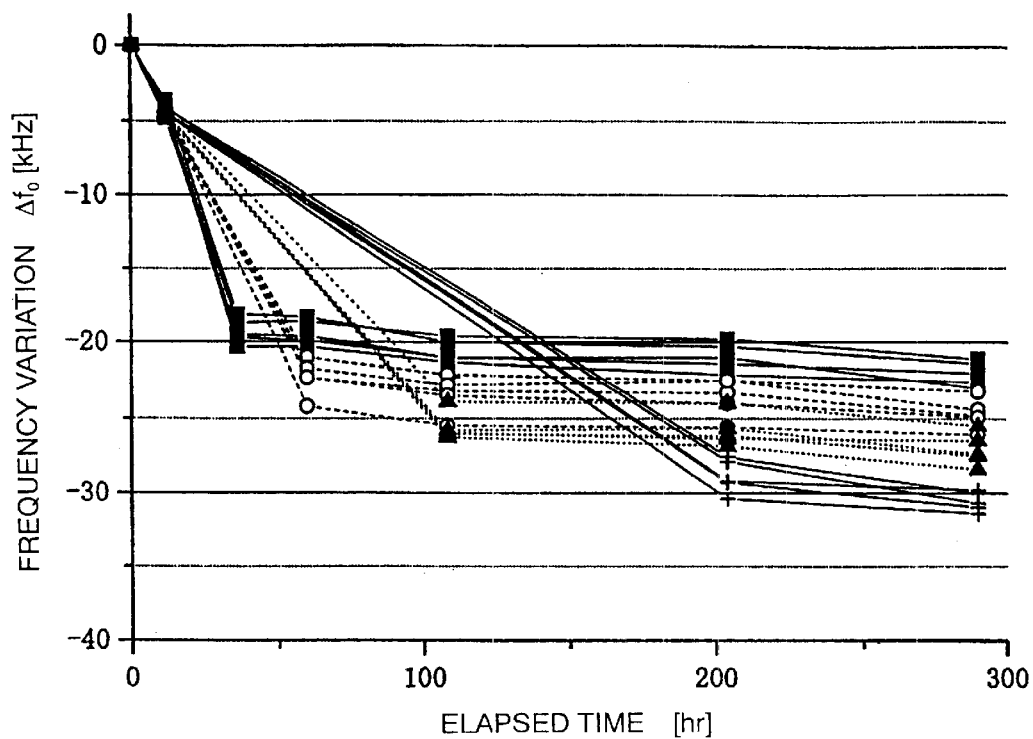
FIG. 3 is a graph showing the variation in frequency of the surface acoustic wave device in the first preferred embodiment of the present invention.

FIG. 3 is a characteristic profile showing the variation in frequency when a device being processed is subjected to a heat treatment after frequency adjustment. The surface acoustic wave device used is obtained by forming an IDT made of Ta on a quartz substrate, and subjecting the resulting device to a heat treatment at about 125° C. The heat treatment is performed 12 hours after frequency adjustment. Symbols including a solid square, open circle, solid triangle, and cross represent the data of samples subjected to a heat treatment for 24 hours, 48 hours, 96 hours, and 192 hours, respectively, and the determination is performed on each five surface acoustic wave devices per each treatment time.

As shown in FIG. 3, the frequencies of the samples vary in nearly the same manner after 12 hours from the frequency adjustment. For example, the frequency of the sample represented by the solid square that is further subjected to a heat treatment for 24 hours after the frequency adjustment is stable at around −20 kHz thereafter. The frequency of the sample represented by the cross symbol that is subjected to a heat treatment for 192 hours is stable at around −30 kHz. As is described above, samples subjected to a heat treatment to form an altered layer made of an oxide film on the surface of IDT exhibit stabilized frequency response characteristics after the formation of the altered layer.

FIG. 3 shows that the variation in frequency can be controlled by selecting the time of heat treatment. Likewise, the variation in frequency can also be controlled by changing the temperature of heat treatment. The control of conditions for the formation of such altered layers provides a fine control procedure after frequency adjustment.

A second preferred embodiment of the present invention will now be illustrated in detail with reference to the drawing.

Figure 4A:
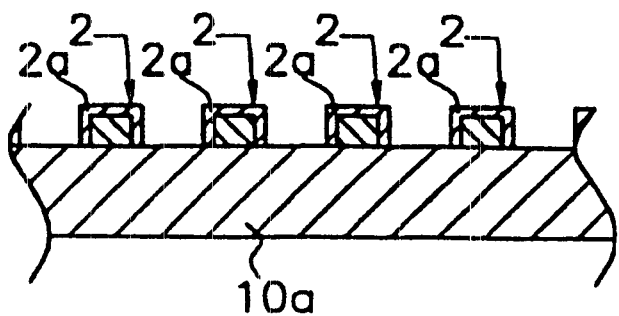
FIGS. 4A to 4C are cross-sectional views showing the state of electrodes of a surface acoustic wave device from frequency adjustment to heat treatment according to a second preferred embodiment of the present invention.
Figure 4B:
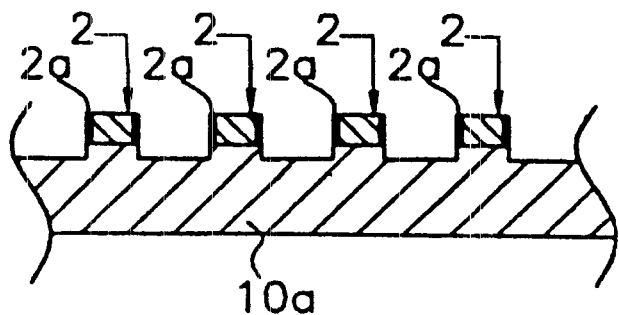
Figure 4C:
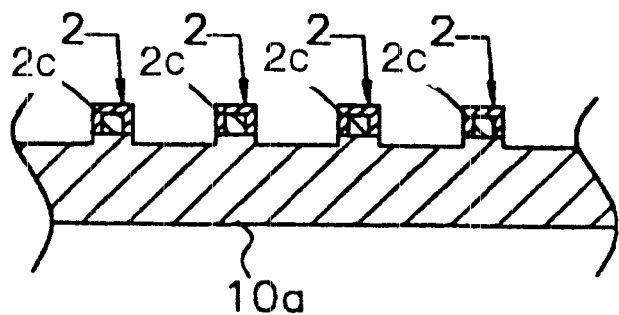

FIGS. 4A to 4C are cross-sectional views showing the state of electrodes of a surface acoustic wave device which is subjected to a frequency adjustment by a non-selective etching such as reversed sputtering or ion gun technique. Individual steps are the same as in FIGS. 1A to 1E, and the same or corresponding elements are denoted with the same numerals. The processes between frequency adjustment and heat treatment will be described below.

As shown in FIG. 4A, an altered layer 2a is formed due to, for example, oxidation in the air on a surface of the IDT 2 on the piezoelectric substrate 10a. In this preferred embodiment, the IDT 2 is trimmed by a technique of colliding ions directly against a device being processed, such as sputtering or ion gun technique in the fifth step for frequency adjustment according to the first preferred embodiment. Accordingly, the entire altered layer 2a on an upper surface of the IDT disappears and the deteriorated layer 2a on a side surface is also trimmed as shown in FIG. 4B to thereby activate the surface of the IDT 2. In contrast to the case shown in FIG. 2, the altered layer 2a on the side surface is also trimmed. This is because the sputtering and ion gun technique serve almost as isotropic etching, and the side surface of the IDT 2 is trimmed to some extent. Accordingly, the side surface is also activated to some extent as compared with the first preferred embodiment, and the variation in frequency due to the alternation of surface becomes a more serious problem than that of the first preferred embodiment.

The surface of the piezoelectric substrate 10a is also trimmed concurrently. If the piezoelectric material of the piezoelectric substrate 10a and the electrode material of the IDT 2 have effects on the frequency $f_o$ that vary in degree from each other, this configuration provides frequency adjustment. For example, when the IDT or other element is formed from an electrode material such as Ta having a higher specific gravity than quartz which is a material for the piezoelectric substrate, the amount of trimming of electrodes such as IDT affects the frequency more than the amount of trimming of the piezoelectric substrate does. As a result, the frequency varies in a direction to trim the electrodes such as IDT.

After the frequency adjustment process is completed as explained above, the device is subjected to a heat treatment in a nitrogen atmosphere to form an altered layer 2c made of a stable nitrided film on the surface of the IDT 2 as shown in FIG. 4C, to thereby stabilize the surface of the IDT 2. A temperature of heat treatment in this procedure is preferably about 85° C. to about 150° C. as the device is packaged, as in the first preferred embodiment. The control of the time and temperature for the formation of the altered layer 2c made of a nitrided film according to the present preferred embodiment also finely controls the frequency, as in the altered layer 2b made of an oxide film according to the first preferred embodiment.

The altered layer 2c made of a nitrided film according to the present preferred embodiment yields more stable characteristics than the altered layer 2b made of an oxide film according to the first preferred embodiment. When Ta is used as an electrode material of IDT, Ta is converted into an altered layer made of $Ta_2O_5$ upon oxidation, and is converted into TaN upon nitriding. In $Ta_2O_5$, the number of oxygen O per one Ta atom is 2.5, and in TaN, the number of nitrogen N per one Ta atom is 1. The ratio by weight per Ta atom is O×2.5:N×1=40:14, and the weight O×2.5 is heavier 2.9 times the weight N×1. The frequency of a sample obtained by oxidation varies more than a sample obtained by nitriding, and the latter sample obtained by nitriding exhibits more stable characteristics. In contrast, if a large variation in frequency is desired, it is recommendable to use the oxidation procedure.

In the first and second preferred embodiments, a two-stage vertically connected surface acoustic wave filter as shown in FIG. 1 is taken as an example of the surface acoustic wave device. However, the surface acoustic wave device is not limited to this type of device, and the present invention can be naturally applied to any surface acoustic devices such as surface acoustic wave resonators, horizontally connected surface acoustic wave filters, ladder filters, lattice filters, and composite filters or shared devices including combinations of these filters and resonators.

A quartz substrate is preferably used as a piezoelectric substrate, and Ta is preferably used as a material of IDT in the first and second preferred embodiments, but these components are not limited to the above examples. The piezoelectric substrate may be made of lithium tantalate, lithium niobate, langasite, langanite, zinc oxide, and other materials. As materials of IDT, Au, Ag, Ta, Mo, Cu, Ni, Cr, Zn, W, Al, Pt, and other materials for the electrode materials of surface acoustic wave devices may be used.

When the manufacturing processes according to various preferred embodiments of the present invention are applied to a surface acoustic wave device using a surface acoustic wave mainly containing SH wave, the advantages achieved for stabilizing the frequency are even greater, because the specific gravity of an electrode material for use in electrodes such as IDT more greatly affects the frequency in such a surface acoustic wave device using a surface acoustic wave mainly containing SH waves than in devices comprising a normal Rayleigh wave.

While preferred embodiments of the invention have been disclosed, various modes of carrying out the principles of the present invention disclosed herein are contemplated as being within the scope of the following claims. Therefore, it is understood that the scope of the present invention is not to be limited except as otherwise set forth in the claims.

What is claimed is:

1. A method for producing a surface acoustic wave device, comprising the steps of:

preparing a piezoelectric substrate;

forming a thin film electrode on the piezoelectric substrate;

etching the thin film electrode for forming an IDT;

trimming at least one of the piezoelectric substrate and the IDT to adjust an operation frequency of the surface acoustic wave device; and altering the surface of the IDT for stabilizing the surface of the IDT.

2. A method according to claim 1, wherein the step of trimming includes trimming each of the piezoelectric substrate and the IDT to adjust an operation frequency of the surface acoustic wave device by physical collision of ions in the step of trimming the IDT and the piezoelectric substrate.

3. A method according to claim 1, wherein the step of altering the surface of the IDT includes the step of heating the IDT in an oxygen atmosphere or in air to oxidize the surface of the IDT.

4. A method according to claim 3, wherein the frequency is finely controlled by changing a heating temperature or a heating time in the step of heating the IDT to oxidize the surface of the IDT.

5. A method according to claim 1, wherein the step of altering the surface of the IDT for stabilizing the surface of the IDT includes a step of heating the IDT in a nitrogen atmosphere to nitride the surface of the IDT.

6. A method according to claim 4, wherein the frequency is finely controlled by changing a heating temperature or a heating time in the step of heating the IDT to nitride the surface of the IDT.

7. A method according to claim 1, wherein the piezoelectric substrate is made of quartz.

8. A method according to claim 1, wherein the metallic film is formed of Ta by vapor deposition or sputtering.

9. A method according to claim 1, wherein the step of etching the thin film electrode for forming an IDT includes etching the thin film electrode to form a multitude of patterns each including a plurality of IDTs and a plurality of reflectors.

10. A method according to claim 9, further comprising the step of adjusting the frequency of the device by reducing the thickness of the patterns by reactive ion etching.

11. A method according to claim 1, wherein the step of trimming includes etching at least one of the IDT, the reflector and the piezoelectric substrate with ions to control frequency response characteristics to desired values.

12. A method according to claim 1, wherein the step of altering the surface of the IDT for stabilizing the surface of the IDT includes the step of heat treating the device in an oxygen atmosphere to increasingly oxidize the surfaces of the IDTs that have been activated by etching in the frequency adjustment step.

13. A method according to claim 1, wherein the step of altering the surface of the IDT for stabilizing the surface of the IDT includes forming an altered layer on the surface of the IDT by oxidizing the IDT in air.

14. A method according to claim 1, wherein the step of trimming at least one of the piezoelectric substrate and the IDT to adjust an operation frequency of the surface acoustic wave device includes the step of reversed sputtering or ion gun processing.

15. A method according to claim 1, wherein the step of trimming at least one of the piezoelectric substrate and the IDT to adjust an operation frequency of the surface acoustic wave device includes the step trimming the surface of the piezoelectric substrate while trimming the IDT.

16. A method according to claim 15, wherein after the step of trimming, subjecting the device to a heat treatment in a nitrogen atmosphere to form an altered layer made of a stable nitrided film on the surface of the IDT to thereby stabilize the surface of the IDT.

17. A method according to claim 16, wherein a temperature of heat treatment is from about 85° C. to about 300° C.

18. A method according to claim 16, further comprising the step of changing a heating temperature or a heating time in the step of heating the IDT to nitride the surface of the IDT.

19. A method for producing a surface acoustic wave device, comprising the steps of:

preparing a piezoelectric substrate;

forming a thin film electrode on the piezoelectric substrate;

etching the thin film electrode for forming an IDT;

trimming each of the piezoelectric substrate and the IDT to adjust an operation frequency of the surface acoustic wave device; and exposing the surface of the IDT to an oxygen or nitrogen atmosphere for stabilizing the surface of the IDT.

20. A method according to claim 19, wherein the step of exposing the surface of the IDT to an oxygen or nitrogen atmosphere includes the step of heating the IDT in the oxygen or nitrogen atmosphere to oxidize or nitride the surface of the IDT.

* * * * *